(12) United States Patent
Woo et al.

(10) Patent No.: US 12,336,091 B2
(45) Date of Patent: Jun. 17, 2025

(54) METHOD FOR MANUFACTURING FLEXIBLE PRINTED CIRCUIT BOARD

(71) Applicant: LG ENERGY SOLUTION, LTD., Seoul (KR)

(72) Inventors: Ga Young Woo, Daejeon (KR); Seog Jin Yoon, Daejeon (KR)

(73) Assignee: LG ENERGY SOLUTION, LTD., Seoul (KR)

( * ) Notice: Subject to any disclaimer, the term of this patent is extended or adjusted under 35 U.S.C. 154(b) by 174 days.

(21) Appl. No.: 17/923,424

(22) PCT Filed: Jun. 11, 2021

(86) PCT No.: PCT/KR2021/007363
§ 371 (c)(1),
(2) Date: Nov. 4, 2022

(87) PCT Pub. No.: WO2021/256790
PCT Pub. Date: Dec. 23, 2021

(65) Prior Publication Data
US 2023/0199945 A1    Jun. 22, 2023

(30) Foreign Application Priority Data
Jun. 17, 2020  (KR) .................. 10-2020-0073635

(51) Int. Cl.
*H05K 1/02*     (2006.01)
*H05K 3/00*     (2006.01)
(Continued)

(52) U.S. Cl.
CPC ........... *H05K 1/028* (2013.01); *H05K 1/0266* (2013.01); *H05K 3/0014* (2013.01);
(Continued)

(58) Field of Classification Search
CPC ............... H05K 1/028; H05K 1/0266; H05K 2201/09936; H05K 2201/09918; H05K 1/0269
See application file for complete search history.

(56) References Cited

U.S. PATENT DOCUMENTS 6,472,820 B1 * 10/2002 Mo ..................... H01J 5/46
                                                           313/583
6,700,070 B1    3/2004 Hellriegel et al.
(Continued)

FOREIGN PATENT DOCUMENTS

JP          8-186369 A       7/1996
JP          11-68286 A       3/1999
(Continued)

OTHER PUBLICATIONS

English Translation JP2014017404, Koichi Shiiba, JTEKT Corp, Published Jan. 30, 2014 (Year: 2014).*
(Continued)

*Primary Examiner* — Steven T Sawyer
(74) *Attorney, Agent, or Firm* — Birch, Stewart, Kolasch & Birch, LLP

(57) ABSTRACT

The present disclosure relates to a flexible printed circuit board (FPCB) and a method for manufacturing a flexible printed circuit board, which is capable of minimizing a process tolerance generated when an outer shape of a board is processed by forming a reference mark in the FPCB and performing an outer shape processing by using the reference mark as a reference point among a series of processes for manufacturing the board.

7 Claims, 5 Drawing Sheets

(51) Int. Cl.
*H05K 3/38* (2006.01)
*H05K 13/04* (2006.01)

(52) U.S. Cl.
CPC ......... *H05K 3/0023* (2013.01); *H05K 3/0047* (2013.01); *H05K 3/381* (2013.01); *H05K 3/384* (2013.01); *H05K 13/04* (2013.01); *H05K 2201/05* (2013.01); *H05K 2201/09936* (2013.01); *H05K 2203/0264* (2013.01); *H05K 2203/0278* (2013.01)

(56) References Cited

U.S. PATENT DOCUMENTS

| | | | |
|---|---|---|---|
| 9,066,455 B2 * | 6/2015 | Takaura | H05K 3/242 |
| 2004/0256701 A1 | 12/2004 | Kiriyama | |
| 2006/0146263 A1 | 7/2006 | Park et al. | |
| 2006/0291179 A1 * | 12/2006 | Tanimori | H05K 3/361 |
| | | | 361/784 |
| 2007/0040286 A1 * | 2/2007 | Liu | H01L 24/29 |
| | | | 257/E23.179 |
| 2008/0101048 A1 * | 5/2008 | Mishiro | H05K 3/361 |
| | | | 29/830 |
| 2008/0296051 A1 | 12/2008 | Yamaguchi | |
| 2009/0178522 A1 | 7/2009 | Saimen | |
| 2009/0323503 A1 * | 12/2009 | Nomura | H05K 3/363 |
| 2012/0305294 A1 | 12/2012 | Takaura | |
| 2015/0029680 A1 * | 1/2015 | Saito | H05K 1/0269 |
| | | | 361/748 |
| 2020/0027843 A1 * | 1/2020 | Liang | H01L 23/544 |
| 2022/0229324 A1 * | 7/2022 | Abe | G02F 1/13452 |

FOREIGN PATENT DOCUMENTS

| | | |
|---|---|---|
| JP | 2000-269472 A | 9/2000 |
| JP | 2002-353589 A | 12/2002 |
| JP | 3383743 B2 | 3/2003 |
| JP | 2003-258395 A | 9/2003 |
| JP | 2003-304041 A | 10/2003 |
| JP | 2007-234915 A | 9/2007 |
| JP | 2009-16416 A | 1/2009 |
| JP | 2011-187514 A | 9/2011 |
| JP | 2012-129389 A | 7/2012 |
| JP | 2014-17404 A | 1/2014 |
| JP | 2018-98448 A | 6/2018 |
| KR | 10-0666282 B1 | 1/2007 |
| KR | 10-0731317 B1 | 6/2007 |
| KR | 10-0810724 B1 | 3/2008 |
| KR | 10-2008-0054136 A | 6/2008 |
| KR | 10-0991756 B1 | 11/2010 |
| KR | 10-1171178 B1 | 8/2012 |
| KR | 10-1500435 B1 | 3/2015 |
| KR | 10-2016-0132646 A | 11/2016 |

OTHER PUBLICATIONS

English Translation JP2002353589, Yamazaki et al.; Published Dec. 6, 2002 (Year: 2002).*
International Search Report (PCT/ISA/210) issued in PCT/KR2021/007363, dated Sep. 29, 2021.

* cited by examiner

METHOD FOR MANUFACTURING FLEXIBLE PRINTED CIRCUIT BOARD

CROSS-REFERENCE TO RELATED APPLICATIONS

This application is the National Phase of PCT International Application No. PCT/KR2021/007363, filed on Jun. 11, 2021, which claims priority under 35 U.S.C. 119(a) to Patent Application No. 10-2020-0073635, filed in the Republic of Korea on Jun. 17, 2020, all of which are hereby expressly incorporated by reference into the present application.

BACKGROUND

The present disclosure relates to a method for manufacturing a flexible printed circuit board, and more particularly, to a method for manufacturing a flexible printed circuit board, which is capable of reducing a machining tolerance generated when an outer shape of the flexible printed circuit board is processed.

In recent years, as a market of electronic devices such as a computer, a notebook computer, and a camera grow, importance of a printed circuit board increases as an essential key component of high integration and packaging.

The printed circuit board (PCB) supports or connects all sorts of components according to a circuit design of electric wires on a raw printed circuit board. The PCB is an essential component in configuring an electronic product.

In recent years, as the electronic product is miniaturized and light-weighted, a flexible printed circuit board (FPCB), as one kind of PCB, which is made of a bendable flexible material to allow three-dimensional wiring and is able to be miniaturized and light-weighted has received attention and has been widely used in small and medium-sized electronic products such as a smartphone, a camera, a notebook computer, a tablet PC.

In general, the above-described FPCB is manufactured through various processes including cutting, drilling, copper plating, scrubbing, Dry film, exposure, etching, P.S.R, Hot press, gold plating, B.B.T, outer shape processing, and final inspection.

Among these manufacturing processes, the outer shape processing process, which processes an outer shape of a circuit board in correspondence with a shape of a product or a device (a smartphone or a notebook computer) to which the FPCB is finally mounted, performs an outer shape processing while setting a guide hole formed outside the circuit board in a printing process as a reference point and compensating a distance from the reference point.

However, although the FPCB is fixed during the outer shape processing, errors may occur in a distance from the reference point due to curl occurrence such as bending caused by characteristic flexibility of a board material.

In this case, since the reference point is not matched during the outer shape processing, a phenomenon in which a connector (or a terminal) is biased to one side instead of being at a center occurs, and thus the circuit board is misaligned with a contact part of the connector and contacts another connector to cause short-circuit.

(Patent document 1) KR10-1500435 B1

SUMMARY

The present disclosure provides a method for reducing a process tolerance generated when an outer shape of a flexible printed circuit board (FPCB) is processed.

In accordance with an exemplary embodiment, a method for manufacturing a flexible printed circuit board (FPCB) includes: a cutting step of cutting a base film including an insulation layer and a copper layer into a panel shape to a predetermined standard; a drilling step of processing a hole passing through all of the insulation layer and the copper layer of the base film; a copper plating step of plating an inner wall of the hole by using copper; a circuit and reference mark forming step of forming a predetermined circuit pattern and a reference mark on the copper layer of the base film; a temporary bonding step of temporarily bonding a coverlay to a predetermined area of a top surface of the copper layer on which the circuit and the reference mark are formed; a complete bonding step of completely bonding the temporarily bonded coverlay to the base film by applying high temperature and high pressure; a surface plating step of plating a surface of an area except for a predetermined area that is not covered by the coverlay; an outer shape processing step of processing an outer shape of the FPCB into a panel-shaped board. Here, the outer shape processing step processes the outer shape by using a reference mark formed in the FPCB through the circuit and in a reference mark forming step as a reference point.

The circuit and reference mark forming step may include: a scrubbing step of roughening a surface of the copper layer; bonding a dry film onto the roughened surface of the base film; a lamination step of laminating the dry film on the copper layer to closely contact the copper layer; an exposure step of irradiating UV light with a shape of the reference mark and a predetermine circuit pattern to be formed on the dry film closely contacting the copper layer; a developing step of removing of a portion of the dry film that is not exposed to the UV light and is not cured; an etching step of oxidizing and removing a portion except for the circuit pattern and the reference mark on the copper layer; and a peeling step of removing the dry film remaining on a surface of the base film to complete formation of the circuit pattern and the reference mark after the etching step.

In an embodiment, the reference mark formed through the circuit and reference mark forming step may be positioned on an area spaced a predetermined distance from a circuit terminal of the board to which a connector is coupled.

In another embodiment, the reference mark formed through the circuit and reference mark forming step may be positioned on an inner area of a circuit terminal of the board to which a connector is coupled.

More particularly, the reference mark may be set as an extension part obtained by extending a pin contact part area being in contact with a connector pin in an inner area of the circuit terminal of the board by a predetermined length.

In accordance with another exemplary embodiment, a flexible printed circuit board (FPCB) includes a circuit terminal to which a connector is coupled and a reference mark, and the reference mark formed in the FPCB acts as a reference point when an outer shape of the board is processed.

In an embodiment, the reference mark may be formed on an area spaced a predetermined distance from the circuit terminal.

In another embodiment, the reference mark may be formed on an inner area of the circuit terminal.

The circuit terminal may include an extension part that is an area obtained by extending a pin contact part area being in contact with a connector pin by a predetermined length.

Here, the reference mark may be set as an extension part area formed in the circuit terminal of the board.

BRIEF DESCRIPTION OF THE DRAWINGS

Exemplary embodiments can be understood in more detail from the following description taken in conjunction with the accompanying drawings, in which.

DETAILED DESCRIPTION OF EMBODIMENTS

Figure 1:
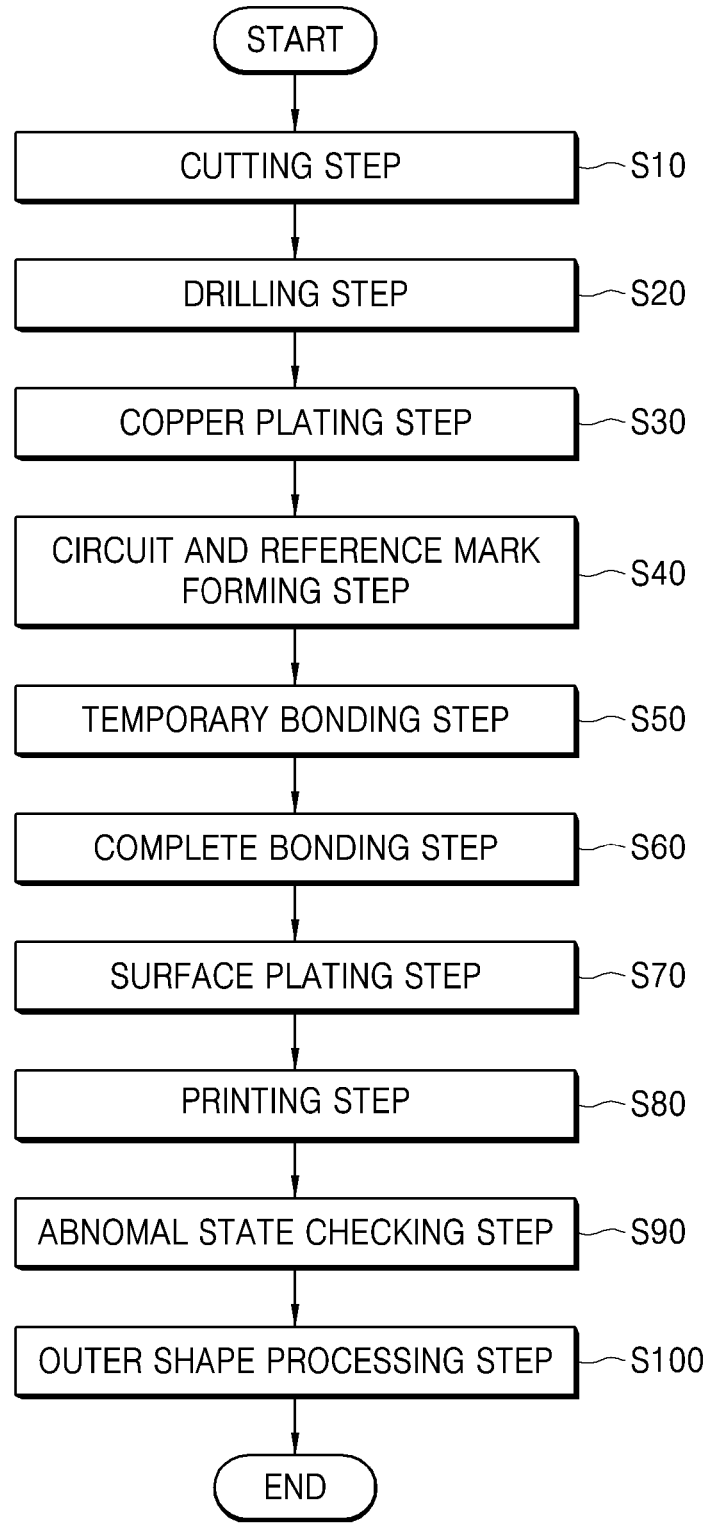
FIG. 1 is a flowchart showing manufacturing steps of a flexible printed circuit board (FPCB) in accordance with an exemplary embodiment.

Hereinafter, preferred embodiments of the present invention will be described in detail with reference to the accompanying drawings in such a manner that the technical idea of the present invention may easily be carried out by a person with ordinary skill in the art to which the invention pertains. The present disclosure may, however, be embodied in different forms and should not be construed as limited to the embodiments set forth herein. In the drawings, anything unnecessary for describing the present disclosure will be omitted for clarity, and also like reference numerals in the drawings denote like elements.

Hereinafter, embodiments of the inventive concept will be described with reference to the accompanying drawings.

1. Method for Manufacturing FPCB in Accordance with an Exemplary Embodiment

FIG. 1 is a flowchart showing a method for manufacturing a flexible printed circuit board (FPCB) in accordance with an exemplary embodiment. Each process will be described with reference to FIG. 1.

1.1. Cutting Step S10

A cutting step, as a first process for producing a flexible printed circuit board product, performs an operation of cutting a base film that is a raw material of a base film based on a work standard. Here, the base film includes an insulation layer (PI) and a thin copper (Cu) layer.

Here, the base film may have a structure in which the insulation layer (PI) is bonded to a top surface of the insulation layer (PI) or a structure in which the thin copper layer is bonded to each of top and bottom surfaces of the insulation layer (PI). In case of the former, a single-surface type FPCB is manufacture, and in case of the latter, a double-surface type FPCB is manufactured.

1.2. Drilling Step S20

A drilling step is a step of processing a hole in the base film to pass through all of the insulation layer (PI) and the thin copper layer of the base film by using a drill.

This step may not be performed when the base film has the single-surface structure in which the thin copper layer is bonded to only the top surface of the insulation layer (PI).

1.3. Copper Plating Step S30

A copper plating step is a step of applying conductivity by plating the inner wall in which the hole is processed in the drilling step by using copper that is a conductor.

This step is a process for electrically connecting the upper and lower thin copper layers with respect to the insulation layer (PI) when the base film has the double-surface structure. This step may not be performed when the base film has the single-surface structure like the drilling step S20.

1.4. Circuit and Reference Mark Forming Step S40

A circuit and reference mark forming step includes: a scrubbing step S41 of allowing a surface of the thin copper layer to be rough so that a dry film (photosensitive film) is properly bonded to the base film; a lamination step S42 of laminating the dry film on the thin copper layer to closely contact the thin copper layer by using heat and pressure; an exposure step S43 of irradiating UV light with a shape of a reference mark and a predetermine circuit pattern to be formed on the dry film closely attached to the thin copper layer of the base film in order to form the circuit and the reference mark; a developing step S44 of removing the dry film of a portion that is not exposed to the UV light and is not cured; an etching step S45 of oxidizing and removing a portion in which the thin copper layer is exposed, i.e., a portion that is not corresponded to the circuit and the reference mark by processing the base film on which the developing step is completed with chemicals; and a peeling step S46 of removing the dry film remained on the surface of the base film to complete formation of the circuit pattern and the reference mark.

Here, as the dry film, which is cured by UV light irradiation in the etching step S45, has a resistance to the chemicals in the etching step 45, the thin copper layer below the dry film is remained as the circuit and the reference mark to be formed.

A typical FPCB manufacturing process forms only the circuit pattern on the base film through scrubbing, lamination, exposure, developing, etching, and peeling processes. However, in an exemplary embodiment, the reference mark is additionally formed in the process of forming the circuit as described above. The reference mark formed in this process serves as a reference point when an outer shape is processed in an outer shape processing step S100 that will be described later.

Here, a position of the reference mark to be formed through the above-described processes may be set according to two embodiments below.

Embodiment 1

Figure 2:
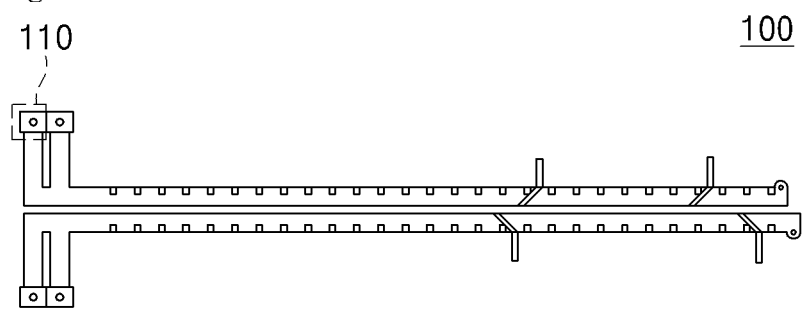
FIG. 2 is a view illustrating an entire shape of the FPCB.
Figure 3:
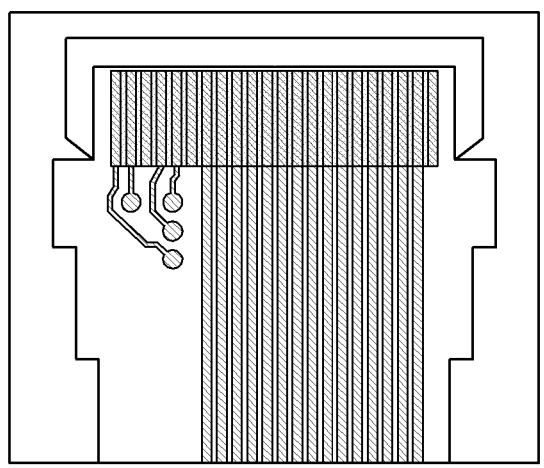
FIG. 3 is an enlarged view illustrating an example of a circuit terminal.

FIG. 2 is a view illustrating an entire appearance of the flexible printed circuit board 100 including a typical FPCB circuit terminal 110 coupled with a connector, and FIG. 3 is an enlarged view illustrating the FPCB circuit terminal 110.

Figure 4:
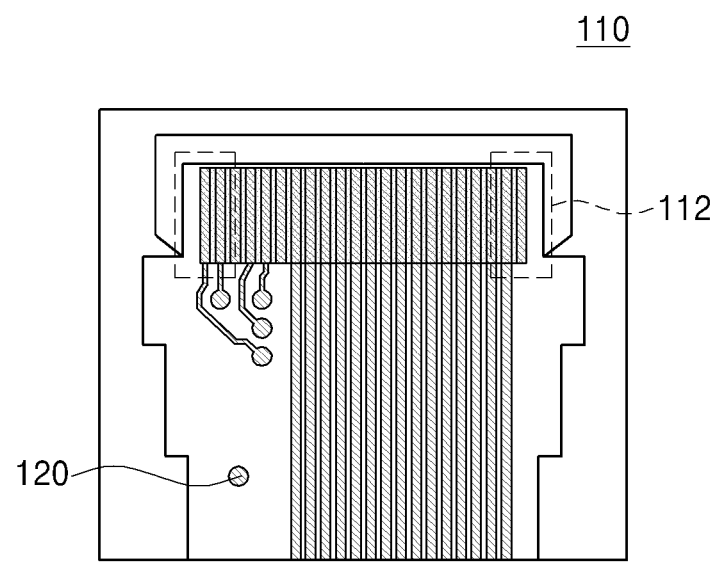
FIG. 4 is a view illustrating a formation position of a reference mark in accordance with an exemplary embodiment.

In case of the embodiment 1, the reference mark 120 may be formed adjacent to the FPCB circuit terminal 110 as illustrated in FIG. 4. When the UV light is irradiated on the dry film closely contacting the copper layer of the base film in the exposure step S43, a predetermined circuit pattern 112 and the reference mark 120 may be formed on the copper layer by irradiating the UV light with a shape realized to include the reference mark set on any one position in an area within a predetermined distance spaced from the FPCB circuit terminal 110 in addition to the predetermined circuit pattern.

Embodiment 2

The embodiment 2 may form the reference mark to be positioned in the FPCB circuit terminal. The predetermined circuit pattern and the reference mark may be by the same method of irradiating the UV light with the shape of the predetermined circuit pattern and the reference mark in the exposure step S43 like the embodiment 1, but the embodiment 2 is different in shape thereof form the embodiment 1.

Figure 5:
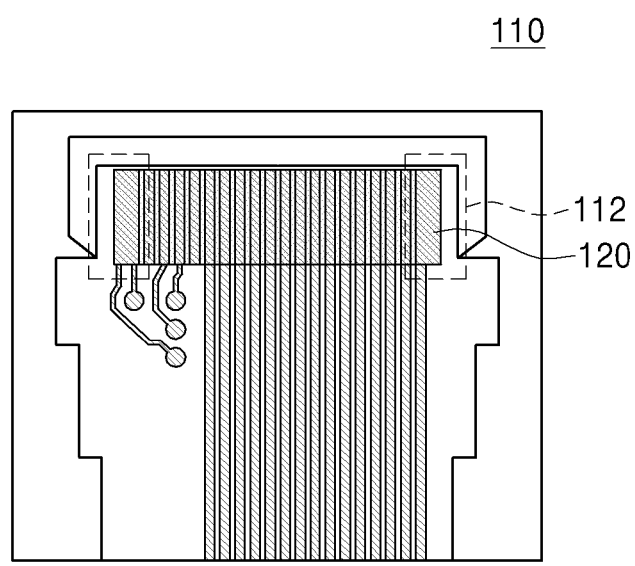
FIG. 5 is a view illustrating a formation position of a reference mark in accordance with another exemplary embodiment.

While the reference mark is realized by a shape disposed adjacent to the FPCB circuit terminal in the embodiment 1, the reference mark is realized by a shape disposed in the FPCB circuit terminal and can be provided at opposite sides of the circuit pattern, in the embodiment 2 as illustrated in FIG. 5.

In this case, specifically, when the shape including the predetermined circuit pattern and the reference mark is realized, a pin contact part area contacting a terminal pin in the FPCB circuit terminal is realized by a shape of an extension part extending a predetermined length in a width direction thereof, and set as the reference mark. That is, as the UV light is irradiated to the thin copper layer of the base film with the shape including the predetermined circuit pattern and the extension part, the predetermined circuit pattern and the reference mark disposed in the FPCB circuit terminal may be formed on the thin copper layer.

As described above, unlike a typical case in which the reference point is positioned outside the FPCB when the outer shape of the FPCB is processed, the reference point is positioned in the FPCB in accordance with an exemplary embodiment by forming the reference point in addition to the circuit pattern in a series of processes of forming the circuit pattern on the board.

Here, although the reference mark has a circular shape in FIGS. 4 and 5, the exemplary embodiment is not limited thereto. For example, the reference mark may have various shapes such as triangular shape or a rectangular shape.

1.5. Temporary Bonding Step S50

A temporary bonding step is a step of temporarily bonding a coverlay to the FPCB product on which the circuit and reference mark forming step S40 is completely performed. Here, the coverlay is used to protect the circuit and form the insulation layer as a FPCB protection film.

Here, when the coverlay is temporarily bonded, a predetermined area to be plated by gold in a surface plating step S70 is excluded to expose the circuit, and the predetermined area refers to a soldering area.

1.6. Complete Bonding Step S60

A complete bonding step is a step of completely bonding the base film to the coverlay that is temporarily bonded in the temporary bonding step by applying high temperature and high pressure. Here, before the high temperature and the high pressure are applied, a typical process (lamination process) of inserting an inserted paper (paper) between thin copper layers corroded through the circuit pattern and reference mark forming step S40 is performed to protect the base film from the high temperature and the high pressure in a state in which the coverlay is temporarily bonded.

1.7. Surface Plating Step S70

After the complete bonding step S60, a process of plating, by using gold, a surface of an area that is not covered by the coverlay, i.e., an area in which the circuit (thin copper layer) as the soldering area is exposed in the temporary bonding step S50.

1.8. Printing Step S80

After the gold plating step, a process of printing product information to be displayed on the FPCB product such as a customer name, a final product code, a component number, a component position, and a rated capacity.

1.9. Abnormal State Checking Step S90

This step is a step of checking whether an electrical function of the FPCB is normal or abnormal to secure an electrical signal property. Since the FPCB form the circuit serving as a wire, this step checks whether the circuit pattern formed through the circuit and reference mark forming step S40 is normal or abnormal. A method for checking whether the electrical function of the FPCB is normal or abnormal may be performed by applying a current to the FPCB to check whether the electrical function such as open or short is normal or abnormal.

1.10. Outer Shape Processing Step S100

An outer shape processing step is a step of processing by using a mold in order to process an outer shape of the FPCB product having a panel shape into a predetermined size and shape.

The outer shape processing step in accordance with an exemplary embodiment processes the outer shape by using the reference mark formed in the FPCB through the circuit pattern and reference mark forming step S40 as a reference point unlike a typical method of processing an outer shape by using a guide hole formed outside the FPCB as a reference point.

As described above, in accordance with an exemplary embodiment, the reference mark is additionally formed in the FPCB, specifically at a position adjacent to the FPCB circuit terminal coupled with a terminal (or a connector) or inside the area, in a series of processes for forming the circuit pattern on the FPCB, and the outer shape processing is performed by using the reference mark as a reference point when the outer shape is processed, to minimize a tolerance generated when the outer shape is processed, thereby improving a production efficiency of the FPCB product.

2. FPCB in Accordance with an Exemplary Embodiment

The FPCB in accordance with an exemplary embodiment is different from the typical FPCB in that the FPCB in accordance with an exemplary embodiment includes the reference mark that is additionally formed through a series of processes of forming the circuit pattern in the FPCB and acts as the reference point when the outer shape is processed as described above while the typical FPCB performs the outer shape processing by using the guide hole formed outside the FPCB as the reference point.

The reference mark formed in the FPCB may be positioned in an area spaced a predetermined distance from the FPCB circuit terminal so as to be adjacent to the FPCB circuit terminal coupled with the terminal (or the connector) as the embodiment 1 shown in FIG. 4 or positioned in the FPCB circuit terminal as the embodiment 2 shown in FIG. 5. Specifically, in case of the embodiment 2, the reference mark may be positioned in an area contacting the terminal (or the connector) in the FPCB circuit terminal.

The reference mark is a thin copper portion distinguished from the circuit and remained in the etching step S45. The reference mark may be formed at a position adjacent to the circuit terminal as shown in FIG. 4 or formed at a position in the circuit terminal as shown in FIG. 5 through a series of processes including a process S43 of irradiating the UV light with the shape of the predetermined circuit pattern and the reference mark to be formed on the dry film closely contacting the thin copper layer, a process S44 of peeling the dry film of the portion that is not exposed to the UV light and is not cured, and a process S45 of oxidizing and removing the portion that is not corresponded to the circuit pattern and the reference mark.

The FPCB in accordance with an exemplary embodiment includes the reference mark disposed adjacent to the FPCB circuit terminal or disposed therein and acting as the reference point when the outer shape is processed to decrease a distance between the FPCB product and the reference point more than the typical case, to minimize the process tolerance generated during the outer shape processing by various factors such as curl generation caused by flexibility that is a property of the FPCB.

The exemplary embodiments may minimize the possibility of process tolerance occurrence due to curl occurrence caused by the flexibility of the board during the outer shape processing by performing the outer shape processing with the reference point inside the FPCB and decreasing the distance between the connector (or terminal) of the FPCB and the reference point.

As described above, the technical idea of the present invention has been specifically described with respect to the above embodiments, but it should be noted that the foregoing embodiments are provided only for illustration while not limiting the present invention. Various embodiments may be provided to allow those skilled in the art to understand the scope of the preset invention, but the present invention is not limited thereto.

What is claimed is:

1. A flexible printed circuit board (FPCB) comprising:
   a circuit terminal including a circuit pattern, the circuit pattern including a plurality of pins, and the circuit terminal being configured to couple to a connector; and
   a reference mark, wherein the reference mark formed in the FPCB acts as a reference point when an outer shape of the FPCB is processed, wherein the reference mark is formed to contact the circuit pattern, the reference mark being disposed at an outer edge of the circuit pattern in a width direction of the circuit terminal, wherein the reference mark includes a first reference mark and a second reference mark, wherein, in a plan view, the first reference mark partially overlaps a lengthwise direction of pins of the plurality of pins, and
   wherein, in the plan view, the second reference mark does not overlap the lengthwise direction of the pins.

2. The FPCB of claim 1, wherein the reference mark is formed on an inner area of the circuit terminal.

3. The FPCB of claim 2, wherein the circuit terminal comprises an extension part that is an area obtained by extending a pin contact part area being in contact with a connector pin by a predetermined length.

4. The FPCB of claim 3, wherein the reference mark is set as an extension part area formed in the circuit terminal of the FPCB.

5. The FPCB of claim 1, wherein the first reference mark is located on a first outer edge of the circuit pattern in the width direction of the circuit terminal, and
   wherein the second reference mark is located on a second outer edge of the circuit pattern in the width direction of the circuit terminal, the first outer edge being opposite to the second outer edge.

6. The FPCB of claim 1, wherein a length of the reference mark in a length direction of the circuit terminal corresponds to a length of the circuit pattern in the length direction of the circuit terminal.

7. The FPCB of claim 1, wherein the reference mark is in a rectangular shape.

* * * * *